(12) United States Patent
Tsai

(10) Patent No.: US 7,663,525 B2
(45) Date of Patent: Feb. 16, 2010

(54) DIGITAL TO ANALOG CONVERTER AND CONVERSION METHOD

(75) Inventor: Jen-Che Tsai, Taichung Hsien (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 11/830,041

(22) Filed: Jul. 30, 2007

(65) Prior Publication Data
US 2008/0030389 A1 Feb. 7, 2008

Related U.S. Application Data

(60) Provisional application No. 60/821,275, filed on Aug. 3, 2006.

(51) Int. Cl.
*H03M 1/66* (2006.01)
(52) U.S. Cl. .................. 341/150; 341/144; 341/172
(58) Field of Classification Search ............ 341/144, 341/172, 143, 150; 330/9
See application file for complete search history.

(56) References Cited

U.S. PATENT DOCUMENTS

| | | | |
|---|---|---|---|
| 5,304,004 A * | 4/1994 | Nunes | 374/208 |
| 5,892,473 A | 4/1999 | Shin | |
| 5,990,819 A * | 11/1999 | Fujimori | 341/150 |
| 6,778,121 B2 * | 8/2004 | Manganaro | 341/150 |
| 6,897,720 B2 * | 5/2005 | Fujimoto | 330/9 |
| 6,952,176 B2 | 10/2005 | Frith et al. | |
| 7,102,558 B2 * | 9/2006 | Deval | 341/150 |
| 2004/0150541 A1 * | 8/2004 | Itoh | 341/118 |

FOREIGN PATENT DOCUMENTS

CN  1175824  3/1998

OTHER PUBLICATIONS

CN Office Action mailed Apr. 24, 2009.
English Abstract of CN1175824.
* cited by examiner

*Primary Examiner*—Jean B Jeanglaude
(74) *Attorney, Agent, or Firm*—Thomas, Kayden, Horstemeyer & Risley

(57) ABSTRACT

A digital to analog converter including a first capacitor, a second capacitor, an operational amplifier, and a switch is disclosed. During a first period, the first capacitor stores a first voltage and the second capacitor stores a second voltage. The operational amplifier comprises an input and an output. The switch parallels the first and the second capacitors with the operational amplifier at the input and output according to a digital signal during a second period.

22 Claims, 3 Drawing Sheets

DIGITAL TO ANALOG CONVERTER AND CONVERSION METHOD

CROSS REFERENCE TO RELATED APPLICATIONS

This application claims the benefit of U.S. Provisional Application No. 60/821,275, filed Aug. 3, 2006, which is incorporated herein by reference.

BACKGROUND OF THE INVENTION

1. Field of the Invention

The invention relates to a converter, and more particularly to a digital to analog converter.

2. Description of the Related Art

DACs are an essential interface circuit for converting signals from the digital domain into the analog domain and, particularly, the analog signal processing domain. DACs are also a key to many analog to digital converter techniques. DACs accept N-bit digital words or data and convert them into an analog voltage signal. The analog voltage signal ranges from zero to a maximum voltage corresponding to a reference voltage provided to the digital to analog converter.

With regard to DAC performance for audio, there is a frequently used delta sigma modulation capable of realizing desired total harmonic distortion (ratio of harmonic component to signal), S/N (signal to noise ratio) or the like. According to the delta sigma modulation, by noise shaping technology, there is achieved an advantage in conversion.

BRIEF SUMMARY OF THE INVENTION

Digital to analog converters are provided. An exemplary embodiment of a digital to analog converter comprises a first capacitor, a second capacitor, an operational amplifier, and a switch. During a first period, the first capacitor stores a first voltage and the second capacitor stores a second voltage. The operational amplifier comprises an input and an output. The switch parallels the first and the second capacitors with the operational amplifier at the input and output according to a digital signal during a second period.

Another exemplary embodiment of a digital to analog converter comprises a first capacitor, a second capacitor, an operational amplifier, a first switch module, and a second switch module. During a first period, the first capacitor stores a first voltage and the second capacitor stores a second voltage. The operational amplifier comprises a non-inverting input, an inverting input, a non-inverting output, and an inverting output. During a second period, the first switch module connects the first capacitor with the operational amplifier in parallel according to a digital signal and the second switch module connects the second capacitor with the operational amplifier in parallel according to the digital signal.

Conversion methods are also provided. During a first period, a first voltage is stored in a first capacitor and a second voltage is stored in a second capacitor. During a second period, the first and the second capacitors are connected to an operational amplifier in parallel according to a digital signal.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
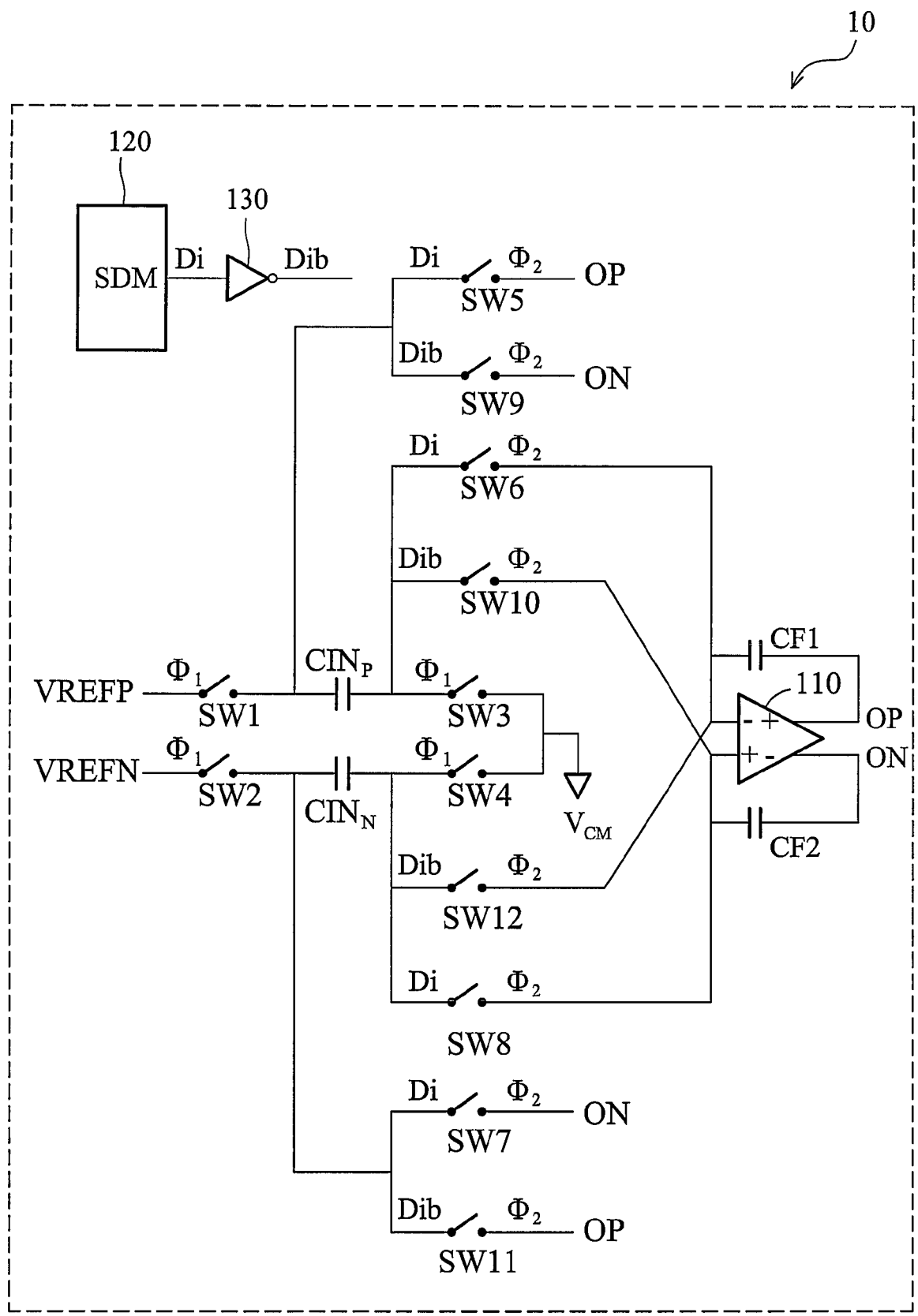
FIG. 1 is a schematic diagram of an exemplary embodiment of a DAC.

FIG. 1 is a schematic diagram of an exemplary embodiment of a DAC. DAC 10 comprises capacitors $CIN_P$, $CIN_N$, CF1, CF2, an operational amplifier 110, and switches SW1~SW12. All nodes labeled OP are coupled together. All nodes labeled ON are coupled together.

Switches SW1~SW4 are controlled by a clock signal $\Phi_1$. Switches SW1, SW3 and capacitor $CIN_P$ are serially connected between a reference voltage VREFP and a common mode voltage $V_{CM}$. Switches SW2, SW4 and capacitor $CIN_N$ are serially connected between a reference voltage VREFN and the common mode voltage $V_{CM}$.

Switches SW5~SW8 are controlled by a clock signal $\Phi_2$ and a digital code Di. Switches SW9~SW12 are controlled by the clock signal $\Phi_2$ and a digital code Dib. The digital code Di is generated by a delta-sigma modulator (DSM) 120. An inverter 130 inverts the digital code Di to generate the digital code Dib. In this embodiment, the DSM 120 generates a single-bit code.

In a first period, switches SW1~SW4 are turned on such that the capacitor $CIN_P$ stores an amount of charge $(VREFP-V_{CM})*CIN_P$ and the capacitor $CIN_N$ stores an amount of charge $(VREFN-V_{CM})*CIN_N$.

In a second period, switches SW5, SW6, SW9, and SW10 connect the capacitor $CIN_P$ to the operational amplifier 110 according to the digital codes Di and Dib. Similarly switches SW7, SW8, SW11, and SW12 connect the capacitor $CIN_N$ to the operational amplifier 110 according to the digital codes Di and Dib.

In this embodiment, the operational amplifier 110 comprises a non-inverting input, an inverting input, a non-inverting output, and an inverting output. The capacitor CF1 is coupled to the operational amplifier 110 in parallel at the inverting input and the non-inverting output. The capacitor CF2 is coupled to the operational amplifier 110 in parallel at the non-inverting input and the inverting output.

In the second period, switches SW5 and SW6 connect the capacitor $CIN_P$ to the inverting input and the non inverting output of the operational amplifier 110 according to the digital code Di. Thus, the capacitor $CIN_P$ is connected to the capacitor CF1 in parallel. Similarly, switches SW7 and SW8 connect the capacitor $CIN_N$ to the non inverting input and the inverting output of the operational amplifier 110 according to the digital code Di. Thus, the capacitor $CIN_N$ is connected to the capacitor CF2 in parallel.

In the second period, switches SW9 and SW10 connect the capacitor $CIN_P$ to the non inverting input and the inverting output of the operational amplifier 110 according to the digital code Dib. Thus, the capacitor $CIN_P$ is connected to the capacitor CF2 in parallel. Similarly, switches SW11 and SW12 connect the capacitor $CIN_N$ to the inverting input and the non inverting output of the operational amplifier 110 according to the digital code Dib. Thus, the capacitor $CIN_N$ is connected to the capacitor CF1 in parallel.

It is assumed that a logic high value of the clock signal $\Phi_1$ or $\Phi_2$ makes the corresponding switches turned on. When the clock signal $\Phi_1$ or $\Phi_2$ is low, the corresponding switches are turned off.

In the first period, the clock signal $\Phi_1$ is high such that switches SW1~SW4 are turned on. The capacitor $CIN_P$ stores the amount of charge $(VREFP-V_{CM})*CIN_P$ and the capacitor $CIN_N$ stores the amount of charge $(VREFN-V_{CM})*CIN_N$.

In the second period, $\Phi_1$ is low and $\Phi_2$ is high. If the digital code Di is high and the digital code Dib is low, the switches SW5~SW8 are turned on and the switches SW1~SW4 are turned off. The capacitor $CIN_P$ is connected to the capacitor CF1 in parallel and the capacitor $CIN_N$ is connected to the capacitor CF2 in parallel. The output signal of the non-inverting output is determined by a charge sharing between $CIN_P$ and CF1. That is, the charge $(VREFP-V_{CM})*CIN_P$ transferred by the second period is added to the parallel connection of $CIN_P$ and CF1. It is noted that CF1 may have charge caused by the last $\Phi_2$. The final charge redistributes on the parallel connection of $CIN_P$ and CF1. The output signal of the inverting output is determined by a charge sharing between $CIN_N$ and CF2. That is, the charge $(VREFN-V_{CM})*CIN_N$ transferred by the second period is added to the parallel connection of $CIN_N$ and CF2. It is noted that CF2 may have charge caused by the last $\Phi_2$. The final charge redistributes on the parallel connection of $CIN_N$ and CF2.

Similarly, if the clock signal $\Phi_2$ and the digital code Dib are high and the clock signal $\Phi_1$ and the digital code Di are low, the switches SW9~SW12 are turned on and the switches SW1~SW4 are turned off. The capacitor $CIN_P$ is connected to the capacitor CF2 in parallel and the capacitor $CIN_N$ is connected to the capacitor CF1 in parallel. The output signal of the non-inverting output is determined by a charge sharing between $CIN_N$ and CF1. That is, the charge $(VREFN-V_{CM})*CIN_N$ transferred by the second period is added to the parallel connection of $CIN_N$ and CF1. It is noted that CF1 may have charge caused by the last $\Phi_2$. The final charge redistributes on the parallel connection of $CIN_N$ and CF1. The output signal of the inverting output is determined by a charge sharing between $CIN_P$ and CF2. That is, the charge $(VREFP-V_{CM})*CIN_P$ transferred by the second period is added to the parallel connection of $CIN_P$ and CF2. It is noted that CF2 may have charge caused by the last $\Phi_2$. The final charge redistributes on the parallel connection of $CIN_P$ and CF2.

As described previously, according to digital code Di, capacitor $CIN_P$ is connected to capacitor CF1 in parallel and the capacitor $CIN_N$ is connected to capacitor CF2 in parallel. Additionally, according to digital code Dib, capacitor $CIN_P$ is connected to capacitor CF2 in parallel and capacitor $CIN_N$ is connected to capacitor CF1 in parallel.

Figure 2:
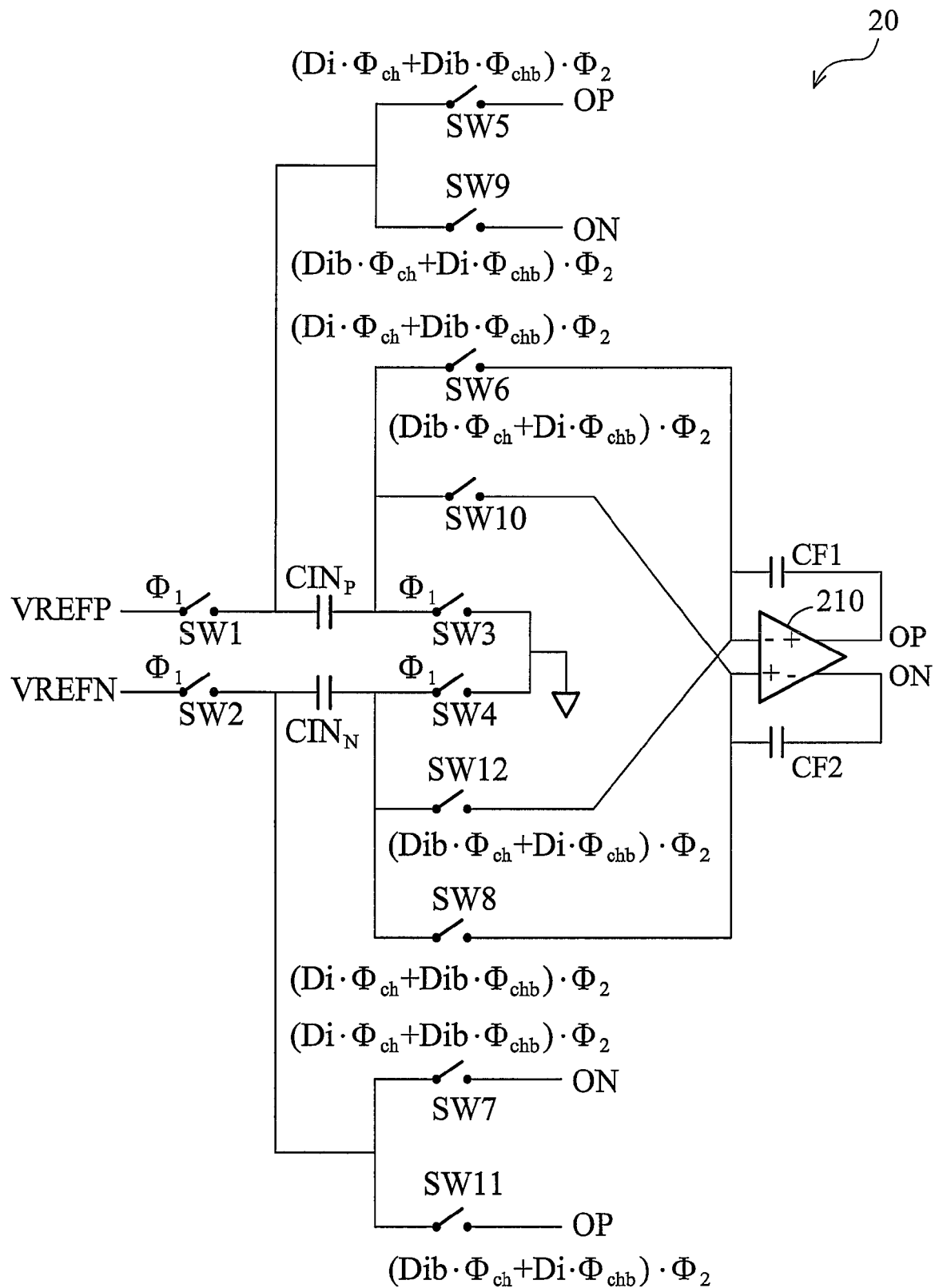
FIG. 2 is a schematic diagram of another exemplary embodiment of the DAC.

FIG. 2 is a schematic diagram of another exemplary embodiment of the DAC. FIG. 2 is similar to FIG. 1 with the exception that DAC 20 provides a chopper function for modulating flicker noises of an operational amplifier 210 into a higher frequency band. The modulated flicker noises can be filtered out. As shown in FIG. 2, switches SW5~SW12 are controlled by the clock signals $\Phi_2$, $\Phi_{ch}$, $\Phi_{chb}$, and digital codes Di and Dib. The clock signal $\Phi_{ch}$ is an inverted signal of the clock signal $\Phi_{chb}$.

The DAC 20 does not require additional switches to achieve the chopper function. Switches SW5~SW12 of DAC 20 additionally consider the clock signals $\Phi_{ch}$ and $\Phi_{chb}$ to comprise the chopper function. The Boolean operation of $(Di*\Phi_{ch}+Dib*\Phi_{chb})$ can be implemented by digital circuits to control the switch SW5. Similarly, SW6-SW12 can be controlled by digital circuits. For performing the chopping function, adding digital operation into a chip is less expensive than adding additional switches on signal paths of the DAC 20.

Figure 3:
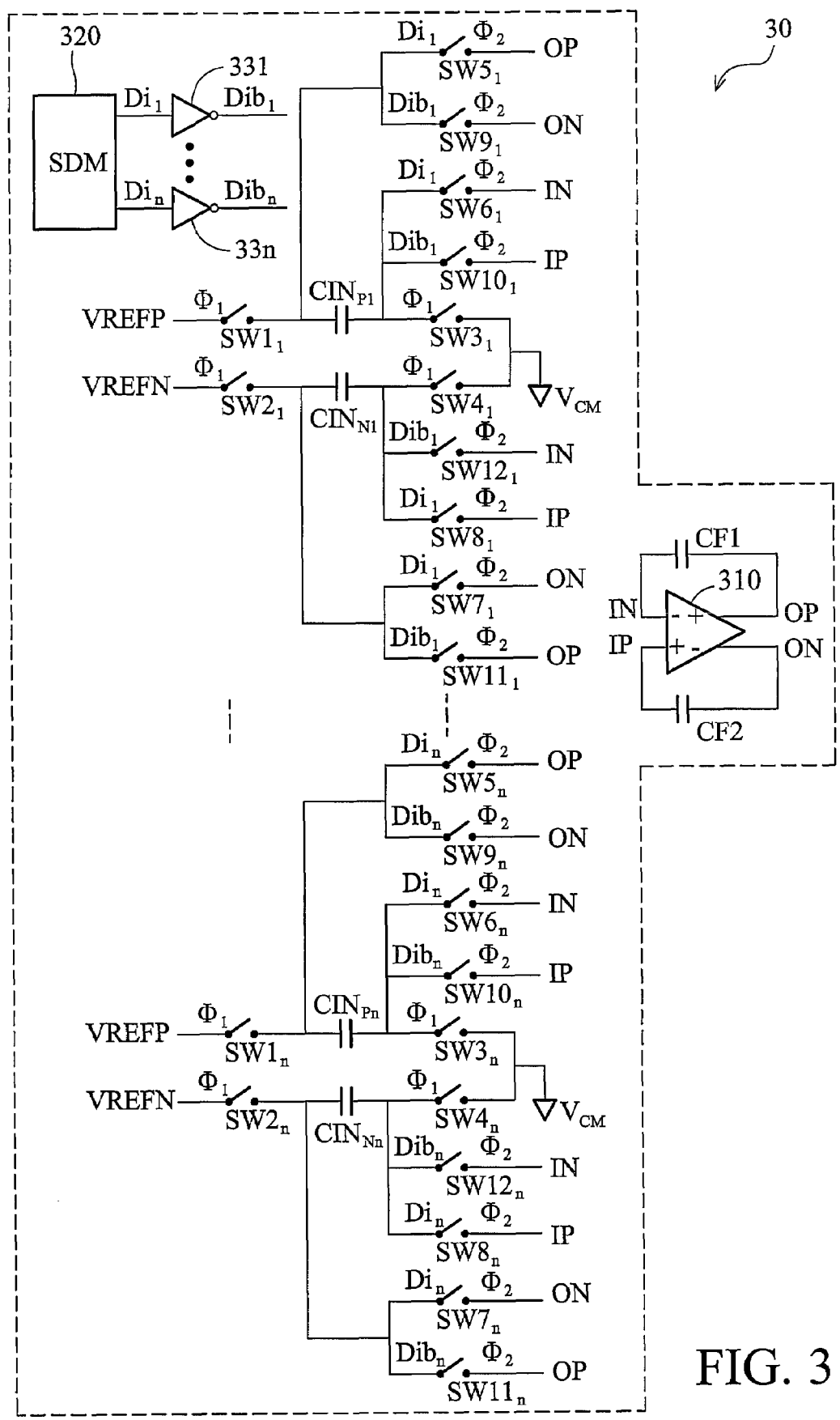
FIG. 3 is a schematic diagram of another exemplary embodiment of the DAC.

FIG. 3 is a schematic diagram of another exemplary embodiment of the DAC. The DAC 30 processes multi-bit codes. Inverters 331~33n respectively process digital codes $Di_1$~$Di_n$ provided by the SDM 320 to generated digital codes $Dib_1$~$Dib_n$. All nodes labeled OP are coupled together. All nodes labeled ON are coupled together. All nodes labeled IP are coupled together. All nodes labeled IN are coupled together.

In the first period, switches $SW1_1$~$SW4_1$ and $SW1_n$~$SW4_n$ are controlled by the clock signal $\Phi_1$ such that the capacitors $CIN_{P1}$ and $CIN_{Pn}$ are charged according to the reference voltage VREFP and $V_{CM}$. The capacitors $CIN_{N1}$ and $CIN_{Nn}$ are charged according to the reference voltage VREFN and $V_{CM}$.

In the second period, switches $SW5_1$~$SW12_1$ are controlled by the clock signal $\Phi_2$ and digital codes $Di_1$ and $Dib_1$ such that the capacitor $CIN_{P1}$ is connected to the capacitor CF1 or CF2 in parallel and the capacitor $CIN_{N1}$ is connected to the capacitor CF2 or CF1 in parallel. Similarly switches $SW5_n$~$SW12_n$ are controlled by the clock signal $\Phi_2$ and digital codes $Di_n$ and $Dib_n$ such that the capacitor $CIN_{Pn}$ is connected to the capacitor CF1 or CF2 in parallel and the capacitor $CIN_{Nn}$ is connected to the capacitor CF2 or CF1 in parallel.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A digital to analog converter, comprising:
   a first capacitor storing a first voltage during a first period;
   a second capacitor storing a second voltage during the first period;
   an operational amplifier comprising a non-inverting input, an inverting input, a non-inverting output, and an inverting output;
   a third capacitor connected between the inverting input and the non-inverting output;
   a fourth capacitor connected between the non-inverting input and the inverting output; and
   a plurality of switches for coupling the first and the second capacitors with the operational amplifier in parallel according to a digital signal during a second period, wherein when the first capacitor is connected to the third capacitor in parallel, the second capacitor is connected to the fourth capacitor in parallel, and wherein when the first capacitor is connected to the fourth capacitor in parallel, the second capacitor is connected to the third capacitor in parallel.

2. The digital to analog converter as claimed in claim 1, further comprising a delta-sigma modulator genereating the digital signal.

3. The digital to analog converter as claimed in claim 1, further comprising an inverter for inverting the digital signal and the switches are coupled to the first and the second capacitors with the operational amplifier in parallel according to the digital signal and the inverted digital signal.

4. A digital to analog converter, comprising:
   a first capacitor storing a first voltage during a first period;

a second capacitor storing a second voltage during the first period;

an operational amplifier comprising a non-inverting input, an inverting input, a non-inverting output, and an inverting output;

a first switch module connecting the first capacitor with the operational amplifier in parallel according to a digital signal during a second period; and a second switch module connecting the second capacitor with the operational amplifier in parallel according to the digital signal during the second period, wherein during the second period, the first capacitor is coupled to the operational amplifier in parallel at the inverting input and the non-inverting output, and the second capacitor is coupled to the operational amplifier in parallel at the non-inverting input and the inverting output according to the digital signal.

5. The digital to analog converter as claimed in claim 4, further comprising:

a third capacitor coupled to the operational amplifier in parallel during the first period; and a fourth capacitor coupled to the operational amplifier in parallel during the first period.

6. The digital to analog converter as claimed in claim 5, wherein during the first period, the third capacitor is coupled to the operational amplifier in parallel at the inverting input and the non-inverting output, and the fourth capacitor is coupled to the operational amplifier in parallel at the non-inverting input and the inverting output.

7. The digital to analog converter as claimed in claim 6, wherein during the second period, the third capacitor connects the first capacitor in parallel and the fourth capacitor connects the second capacitor in parallel.

8. The digital to analog converter as claimed in claim 6, wherein during the second period, the third capacitor connects the second capacitor in parallel and the fourth capacitor connects the first capacitor in parallel.

9. The digital to analog converter as claimed in claim 4, further comprising a delta-sigma modulator generating the digital signal.

10. A conversion method, comprising:

during a first period, storing a first voltage in a first capacitor and storing a second voltage in a second capacitor; and during a second period, connecting the first and the second capacitors with an operational amplifier in parallel according to a digital signal, wherein the connecting step comprises:

connecting the first capacitor with the operational amplifier in parallel at an inverting input and a non-inverting output; and connecting the second capacitor with the operational amplifier in parallel at a non-inverting input and an inverting output.

11. The conversion method as claimed in claim 10, further comprising during the second period, connecting the first capacitor with a third capacitor in parallel and connecting the second capacitor with a fourth capacitor in parallel.

12. The conversion method as claimed in claim 11, wherein during the first period, the third and the fourth capacitors are coupled to the operational amplifier in parallel.

13. The conversion method as claimed in claim 10, further comprising utilizing a delta-sigma modulator to generate the digital signal.

14. The conversion method as claimed in claim 10, further comprising:

during the first period, connecting the first capacitor with a third capacitor in parallel; and during the first period, connecting the second capacitor with a fourth capacitor in parallel.

15. The conversion method as claimed in claim 14, further comprising:

during the first period, connecting the third capacitor with the operational amplifier in parallel at the inverting input and the non-inverting output; and during the first period, connecting the fourth capacitor with the operational amplifier in parallel at the non-inverting input and the inverting output.

16. The conversion method as claimed in claim 15, further comprising:

during the second period, connecting the third capacitor with the first capacitor in parallel; and during the second period, connecting the fourth capacitor with the second capacitor in parallel.

17. A digital to analog converter, comprising:

a first capacitor storing a first voltage during a first period;

a second capacitor storing a second voltage during the first period;

an operational amplifier comprising a non-inverting input, an inverting input, a non-inverting output, and an inverting output;

a first switch module connecting the first capacitor with the operational amplifier in parallel according to a digital signal during a second period; and a second switch module connecting the second capacitor with the operational amplifier in parallel according to the digital signal during the second period, wherein during the second period, the first capacitor is coupled to the operational amplifier in parallel at the non-inverting input and the inverting output, and the second capacitor is coupled to the operational amplifier in parallel at the inverting input and the non-inverting output according to the digital signal.

18. The digital to analog converter as claimed in claim 17, further comprising:

a third capacitor coupled to the operational amplifier in parallel during the first period; and a fourth capacitor coupled to the operational amplifier in parallel during the first period.

19. The digital to analog converter as claimed in claim 18, wherein during the first period, the third capacitor is coupled to the operational amplifier in parallel at the inverting input and the non-inverting output, and the fourth capacitor is coupled to the operational amplifier in parallel at the non-inverting input and the inverting output.

20. The digital to analog converter as claimed in claim 19, wherein during the second period, the third capacitor connects the first capacitor in parallel and the fourth capacitor connects the second capacitor in parallel.

21. The digital to analog converter as claimed in claim 19, wherein during the second period, the third capacitor connects the second capacitor in parallel and the fourth capacitor connects the first capacitor in parallel.

22. The digital to analog converter as claimed in claim 17, further comprising a delta-sigma modulator generating the digital signal.

* * * * *